US006798074B2

(12) United States Patent
Cheng et al.

(10) Patent No.: US 6,798,074 B2
(45) Date of Patent: Sep. 28, 2004

(54) METHOD OF ATTACHING A DIE TO A SUBSTRATE

(75) Inventors: Man Hon Cheng, Tsuen Wan (HK); Wai Wong Chow, Sheung Shue (HK); Wai Keung Ho, Tsz Wan Shan (HK)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/090,094

(22) Filed: Mar. 4, 2002

(65) Prior Publication Data

US 2003/0164553 A1 Sep. 4, 2003

(51) Int. Cl.[7] .............................................. H01L 23/52
(52) U.S. Cl. .................. 257/783; 257/666; 257/676; 257/787
(58) Field of Search ............................... 257/676, 666, 257/782, 784, 787, 783

(56) References Cited

U.S. PATENT DOCUMENTS

| | | | |
|---|---|---|---|
| 5,122,860 A | * | 6/1992 | Kikuchi et al. ............. 257/679 |
| 6,265,530 B1 | | 7/2001 | Herr |
| 2001/0012680 A1 | | 8/2001 | Cobbley |
| 2002/0182774 A1 | * | 12/2002 | Heckman ................... 438/118 |

OTHER PUBLICATIONS

National Semiconductor Corporation, Semiconductor Packaging Assembly Technology, Aug. 1999.
National Semiconductor Corporation, Plastic Package Moisture–Induced Cracking, Aug. 1999.
Ruihua Han, Linhuo Shi, and Mahesh Gupta, Three–Dimensional Simulation of Microchip Encapsulation Process, Department of Mechanical Engineering–Engineering Mechanics, Michigan Technological University, Houghton, Michigan 49931.

* cited by examiner

Primary Examiner—Luan Thai
(74) Attorney, Agent, or Firm—Charles Bergere

(57) ABSTRACT

A semiconductor device 30 includes a base carrier 32, an adhesive material layer 36 and an integrated circuit die 34. The base carrier 32 has a top side and a bottom side, the top side having a central area for receiving the die 34 and a peripheral area surrounding the central area. The adhesive material layer 36 is disposed on the top side of the base carrier in an "X" shaped pattern. The "X" shaped pattern includes two bisecting lines. The two bisecting lines extend well beyond the central area and into the peripheral area of the base carrier top surface. The die 34 is attached to the base carrier 32 with the adhesive material layer 36 at the central area. Even after attachment of the die 34, the adhesive material 36 extends well beyond the die 34 and the central area into the peripheral area.

10 Claims, 2 Drawing Sheets

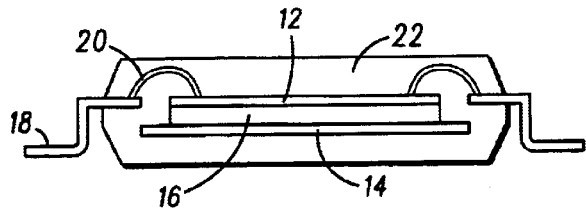
FIG. 1 -PRIOR ART-
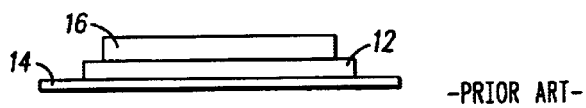
FIG. 2 -PRIOR ART-
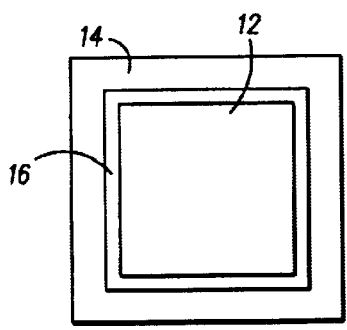
FIG. 3 -PRIOR ART-
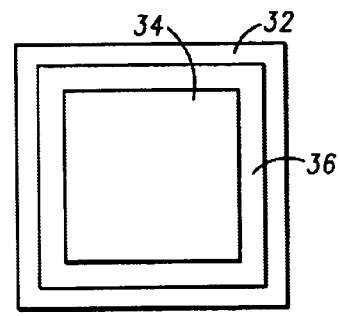
FIG. 4
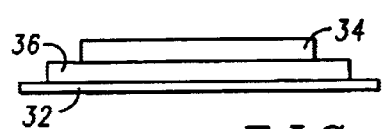
FIG. 5
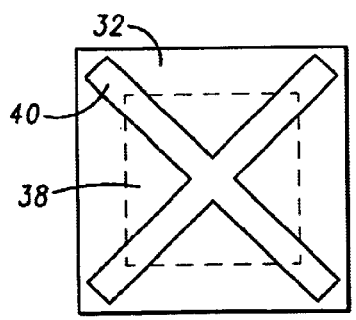
FIG. 6
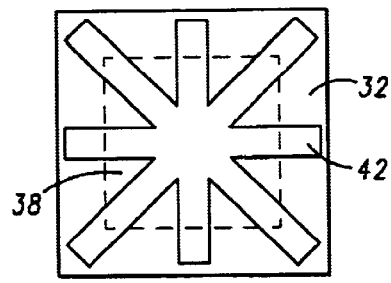
FIG. 7

METHOD OF ATTACHING A DIE TO A SUBSTRATE

BACKGROUND OF THE INVENTION

The present invention relates to integrated circuits and a method of packaging integrated circuits and, more particularly, to a method of attaching a die to a substrate.

An integrated circuit (IC) die is a small device formed on a semiconductor wafer, such as a silicon wafer. Such a die is typically cut from the wafer and attached to a substrate or base carrier for interconnect redistribution. Bond pads on the die are then electrically connected to the leads on the carrier via wire bonding. The die and wire bonds are encapsulated with a protective material such that a package is formed. The leads encapsulated in the package are redistributed in a network of conductors within the carrier and end in an array of terminal points outside the package. Depending on the package type, these terminal points may be used as-is, such as in a Thin Small Outline Package (TSOP), or further processed, such as by attaching spherical solder balls for a Ball Grid Array (BGA). The terminal points allow the die to be electrically connected with other circuits, such as on a printed circuit board. IC die can also be attached to other die to form a stacked multichip device.

Referring now to FIG. 1, an enlarged side view of a conventional TSOP 10 is shown. The TSOP 10 includes an integrated circuit or die 12 attached to a paddle 14 with an adhesive material layer 16. The integrated circuit 12 is electrically connected to pins 18 of a leadframe with wirebonds 20. The circuit 12, paddle 14, and wirebonds 20 are encapsulated, such as with a molded plastic 22.

The conventional die attach method covers the paddle 14 with an amount of adhesive material 16 that matches the exact die size only. Thus, as shown in FIG. 2, when the integrated circuit 12 is pressed onto the adhesive material 16, the adhesive material 16 only extends beyond the die size by a distance that is equal to about the height of the die or integrated circuit 12.

FIG. 3 is a top plan view of the integrated circuit 12 attached to the paddle 14 with the adhesive material 16. As can be seen, there is a large portion of the paddle 14 that is not covered by either the integrated circuit 12 or the adhesive material 16.

Some devices are packaged using an exposed pad (EP) design in order to enhance heat dissipation and improve certain electrical characteristics. In an exposed die attach pad design, the die attach pad is soldered directly onto the PCB. That is, the die is attached directly to a metal paddle, which is directly soldered to the PCB. However, special care must be taken when handling and soldering these EP packages. Such EP packages must be handled in a dry environment prior to soldering and exposure to moisture must be minimized prior to assembly to ensure reliable performance. The coverage of the adhesive material 16 during the die attach process is critical to field operation reliability. Voids and variations in thickness of the adhesive material 16 are undesirable. Further, insufficient coverage of the die attach material 16 makes the device susceptible to reliability failures, due to, for example, delamination. Moisture buildup in the die attach adhesive can also cause delamination. The aforedescribed die attach method only marginally achieves Moisture Sensitive Level Three (MSL-3) at 240° C. reflow condition.

It would be desirable to be able to attach a die to a paddle, substrate or carrier with an adhesive such that the device is less sensitive to moisture and more reliable.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings:

FIG. 1 is an enlarged cross-sectional view of a conventional thin small outline package;

FIG. 2 is an enlarged side view of an IC die attached to a carrier in a conventional manner;

FIG. 3 is an enlarged top plan view the die and carrier of FIG. 2;

FIG. 4 is an enlarged top plan view of a die attached to a carrier in accordance with a first embodiment of the present invention;

FIG. 5 is an enlarged side view of the die and carrier of FIG. 4;

FIG. 6 is an enlarged top plan view of a first pattern of die attach material in accordance with an embodiment of the present invention;

FIG. 7 is an enlarged top plan view of a second pattern of die attach material in accordance with an embodiment of the present invention.

DETAILED DESCRIPTION OF PREFERRED EMBODIMENTS

Figure 8:
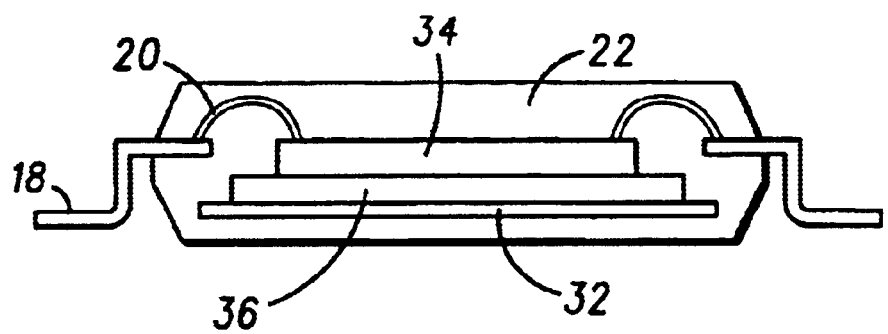
FIG. 8 is an enlarged cross-sectional view of a thin small outline package in accordance with an embodiment of the present invention.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention. For simplicity, examples used to illustrate the invention refer to TSOPs. However, the present invention can be applied to other packages and is especially useful for EP type packages in which at least one side of a metal die pad is exposed.

Certain features in the drawings have been enlarged for ease of illustration and the drawings and the elements thereof are not necessarily in proper proportion. However, those of ordinary skill in the art will readily understand such details. In the drawings, like numerals are used to indicate like elements throughout.

In order to provide a reliable integrated circuit the present invention is a semiconductor device, comprising a base carrier, an adhesive material layer, and an integrated circuit die. The base carrier has a top side and a bottom side, the top side having a central area and a peripheral area. The central area is for receiving the integrated circuit die. The adhesive material layer is disposed on the top side of the base carrier. The adhesive material layer covers substantially all of the central and peripheral areas of the base carrier top surface. The integrated circuit die is attached to the base carrier with the adhesive material layer at the central area.

The present invention also provides a novel die attach dispensing pattern that is very effective in enhancing the delamination resistance at the paddle interfaces under JEDEC conditions MSL-1 at 240° C. and MSL-2 at 260° C. reflow. In accordance with this embodiment, the present invention provides a semiconductor device, comprising a base carrier, an adhesive material layer, and an integrated circuit die. The base carrier has a top side and a bottom side, the top side having a central area for receiving the die and a peripheral area. The adhesive material layer is disposed on the top side of the base carrier. The adhesive material layer is dispensed on the top side of the base carrier in an "X" shaped pattern having two bisecting lines that extend beyond the central area and into the peripheral area of the base carrier top surface. The die is attached to the base carrier with the X-shaped adhesive material layer at the central area.

The present invention further comprises dispensing die attach material onto a top surface of a paddle such that the die attach material covers substantially the entire top surface of the paddle, regardless of the size of a die to be attached to the paddle. Thus, according to this embodiment, the present invention provides a method of attaching an integrated circuit die to a base carrier comprising the steps of:

dispensing an adhesive material onto a central area of a top surface of the base carrier, wherein the central area is sized to receive the integrated circuit die and the central area is surrounded by a peripheral area; and attaching a bottom surface of the integrated circuit die to the central area on the top surface of the base carrier with the adhesive material, wherein the adhesive material dispensed onto the top surface of the base carrier extends well into the peripheral area of the base carrier top surface.

Referring now to FIG. 4, a top plan view of a portion of a semiconductor device 30 in accordance with the present invention is shown. The device 30 includes a base carrier 32 having a top surface (partially visible) and a bottom surface. The top surface has a central area for receiving an integrated circuit die 34 and a peripheral area. As shown in the drawing, the peripheral area surrounds the central area and the die 34. The base carrier 32 is of a type well known to those of ordinary skill in the art. The base carrier 32 may be a lead frame paddle, a printed circuit board, a substrate, etc.

An adhesive material layer 36 is disposed on the top surface of the base carrier 32. The adhesive material layer 36 covers a large part of the central and peripheral areas of the top surface of the base carrier 32. That is, according to the present invention, the device 30 has extended adhesive material coverage. Extended adhesive material coverage means that the adhesive material extends beyond the edges of the die 34 and such extension is greater than or equal to two times the thickness of the die. FIG. 5 is an enlarged side view illustrating how the adhesive material layer 36 extends well beyond the central area (i.e., the perimeter of the die 34) and into the peripheral area.

The adhesive material 36 is a die attach adhesive preferably of a type well known to those of skill in the art that provides low moisture absorption and thermal dissipation. If a conductive adhesive material is used, it is preferred to provide uniform intermetallic formation. Some example adhesives are solder, epoxy, modified epoxy, and Cyanate Ester blends. The adhesive material may be filled with particles to increase thermal dispersion properties.

The integrated circuit die 34 is attached to the base carrier 32 with the adhesive material layer 36 at the central area of the base carrier 32. After the die 34 is attached, the adhesive material is cured, typically at a temperature ranging between 125–175 degrees C. The integrated circuit die 34 may be of a type known to those of skill in the art, such as a circuit formed on and cut from a silicon wafer. The central area of the top surface of the base carrier 32 is sized and shaped to receive the die 34. Typical die sizes may range from 4 mm×4 mm to 12 mm×12 mm. The die 34 may have a thickness ranging from about 6 mils to about 21 mils. For example, if the die 34 is 8 mm×8 mm×6 mils, then the central area is 8 mm×8 mm and a distance from an edge of the central area to an outer edge of the peripheral area (i.e., the width of the peripheral area) is greater than 12 mils and is usually in a range of about 13 mils to 15 mils.

As previously discussed, the adhesive material layer 36 extends well beyond the central area and covers substantially all of the top surface of the base carrier 32. In another example, if the die 34 is 8 mm×8 mm×6 mils and the base carrier 32 is 12 mm×12 mm, then the adhesive material layer 36 is preferably about 10.4 mm×10.4 mm.

In one embodiment of the invention, the base carrier 32 may be a paddle of a leadframe. In such embodiment, bonding pads on the die 34 can be wirebonded to fingers of the leadframe in a well known manner, so that the die 34 is electrically connected to the leadframe fingers. The base carrier or paddle 32, the die 34 and at least a portion of the leadframe fingers may be encapsulated with a plastic or epoxy resin material, which forms a protective seal. The present invention provides the most benefit to EP type packages because EP packages usually need to maximize the exposed pad regardless of the die size for maximum thermal performance, which creates more cases of a small die on a large die pad. Packages in fully encapsulated form, such as shown in FIG. 1, and packages using an organic substrate, like BGAs, benefit less from the extended adhesive material coverage of the present invention.

Referring now to FIG. 6, in a preferred embodiment of the invention, the base carrier 32 includes a central area 38 for receiving an integrated circuit die, and a peripheral area. A die attach material 40 is dispensed on a surface of the base carrier 32 in an "X" shaped pattern, with the legs of the "X" extending well beyond the central area 38 and into the corners of the base carrier 32. The "X" shaped pattern includes two bisecting lines that extend beyond the central area 38 and into the peripheral area of the base carrier top surface. An integrated circuit die can then be attached to the central area 38 base carrier 32 with the adhesive material layer. The die attach or adhesive material can be dispensed in controlled amounts on to the base carrier 32 using commercially available equipment.

Referring now to FIG. 7, in another preferred embodiment of the invention, the base carrier 32 includes a central area 38 for receiving an integrated circuit die, and a peripheral area. A die attach material 42 is dispensed on a surface of the base carrier 32 in a star shaped pattern. As can be seen, the points of the star shaped pattern extend well beyond the central area 38 and into the corners of the base carrier 32. More particularly, the star shaped pattern includes two bisecting lines that extend beyond the central area 38 and into the corners of the peripheral area of the base carrier top surface. The star shaped pattern can include either one or two additional lines. For example, the pattern may include a first line extending from a middle part of the peripheral area of a first side of the base carrier 32 to a middle part of the peripheral area of a second, opposing side of the base carrier 32 such that the adhesive material layer 42 forms a six pointed star.

The star shaped pattern can also include a second line extending from a middle part of the peripheral area of a third side of the base carrier 32 to a middle part of the peripheral area of a fourth, opposing side of the base carrier 32 such that the adhesive material layer 42 forms an eight pointed star. An integrated circuit die can then be attached to the central area 38 base carrier 32 with the star shaped adhesive material layer 42.

FIG. 8 is an enlarged cross-sectional view of a thin small outline package 50 in accordance with an embodiment of the present invention is shown. The TSOP 50 includes the integrated circuit die 34 attached to the base carrier 32, which in this case is a die paddle, with the extended adhesive material layer 36. The integrated circuit die 34 is electrically connected to the pins 18 of a leadframe with wires 20 in a known manner, such as by wirebonding the wires 20 to pads on the die 34 and to the leadframe pins 18. The die 34, base carrier 32, and wires 20 are encapsulated with an encapsulant, such as with the molded plastic 22.

In accordance with the present invention, a method of attaching an integrated circuit die to a base carrier includes the steps of dispensing an adhesive material onto the central area of a top surface of the base carrier and then attaching a bottom surface of the integrated circuit die to the central area on the top surface of the base carrier with the adhesive material. As previously discussed, the central area is sized to receive the integrated circuit die and the central area is surrounded by a peripheral area. The adhesive material is dispensed onto the top surface of the base carrier such that it extends well into the peripheral area of the base carrier top surface. The adhesive material is dispensed in a controlled manner and in a predetermined pattern, such as "X" shaped or star shaped.

The present invention provides a simple and inexpensive way to improve EP package moisture level performance and does not require any major material changes. The present invention also allows a single lead frame part, with a large die pad, for both large and small size devices, which reduces leadframe inventory variety.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. In addition, the die and paddle sizes may vary to accommodate the required package design. It is understood, therefore, that this invention is not limited to the particular embodiments disclosed, but covers modifications within the spirit and scope of the present invention as defined by the appended claims.

What is claimed is:

1. A semiconductor device, comprising:
    a base carrier having a top side and a bottom side, the top side having a central area for receiving an integrated circuit die and a peripheral area;
    an extended adhesive material layer disposed on the top side of the base carrier, the adhesive material layer covering the central area and a large portion of the peripheral area of the base carrier top surface, wherein the adhesive material extends beyond edges of the die a distance greater than about two times a thickness of the die; and
    an integrated circuit die attached to the base carrier with the adhesive material layer at the central area.

2. The semiconductor device of claim 1, wherein the base carrier comprises a paddle.

3. The semiconductor device of claim 2, further comprising a leadframe electrically connected to the integrated circuit die.

4. The semiconductor device of claim 3, further comprising an encapsulant surrounding the base carrier, the integrated circuit die and at least a portion of the leadframe.

5. A semiconductor device, comprising:
    a base carrier having a top side and a bottom side, the top side having a central area tar receiving an integrated circuit die and a peripheral area;
    an extended adhesive material layer disposed on the top side of the base carrier, wherein the adhesive material layer is dispensed on the top side of the base carrier in an "X" shaped pattern, the "X" shaped pattern including two bisecting lines, wherein the two bisecting lines extend beyond the central area and into the peripheral area of the base carrier top surface, wherein the adhesive material extends beyond edges of the die a distance greater than about two times a thickness of the die; and
    an integrated circuit die attached to the base carrier with the adhesive material layer at the central area.

6. The semiconductor device of claim 5, wherein the "X" shaped pattern of adhesive material further includes a first line extending front a middle part of the peripheral area of a first side of the base carrier to a middle part of the peripheral area of a second, opposing side of the base carrier such that the adhesive material layer forms a six pointed star.

7. The semiconductor device of claim 6, wherein the "X" shaped pattern of adhesive material further includes a second line extending from a middle part of the peripheral area of a third side of the base carrier to a middle part of the peripheral area of a fourth, opposing side of the base carrier such that the adhesive material layer forms an eight pointed star.

8. The semiconductor device of claim 5, wherein the base carrier comprises a paddle.

9. The semiconductor device of claim 8, further comprising a leadframe electrically connected to the integrated circuit die.

10. The semiconductor device of claim 9, further comprising an encapsulant surrounding the base carrier, the integrated circuit die and at least a portion of the leadframe.

* * * * *